US012749651B2

(12) United States Patent
Mao et al.

(10) Patent No.: US 12,749,651 B2
(45) Date of Patent: Sep. 29, 2026

(54) SEMICONDUCTOR REACTION CHAMBER

(71) Applicant: BEIJING NAURA MICROELECTRONICS EQUIPMENT CO., LTD., Beijing (CN)

(72) Inventors: Xingfei Mao, Beijing (CN); Gang Wei, Beijing (CN); Wei Wang, Beijing (CN); Guodong Chen, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 153 days.

(21) Appl. No.: 18/190,930

(22) Filed: Mar. 27, 2023

(65) Prior Publication Data

US 2023/0230803 A1 Jul. 20, 2023

Related U.S. Application Data

(63) Continuation of application No. PCT/CN2021/119560, filed on Sep. 22, 2021.

(30) Foreign Application Priority Data

Sep. 27, 2020 (CN) ......................... 202011032583.8

(51) Int. Cl.
*H01J 37/32* (2006.01)
*H01J 37/22* (2006.01)
(Continued)

(52) U.S. Cl.
CPC ......... *H01J 37/32119* (2013.01); *H01J 37/22* (2013.01); *H01J 65/044* (2013.01);
(Continued)

(58) Field of Classification Search
CPC ...... H01J 37/22; H01J 37/32; H01J 37/32082; H01J 37/321; H01J 37/32119;
(Continued)

(56) References Cited

U.S. PATENT DOCUMENTS 4,266,167 A * 5/1981 Proud .................. H01J 65/046 315/39
4,642,171 A * 2/1987 Sekine ................. C23C 16/483 422/186

(Continued)

FOREIGN PATENT DOCUMENTS

CN 1377457 A 10/2002
CN 103287088 A 9/2013

(Continued)

*Primary Examiner* — Gordon Baldwin
*Assistant Examiner* — Joshua Reyes
(74) *Attorney, Agent, or Firm* — Anova Law Group, PLLC

(57) ABSTRACT

A semiconductor reaction chamber includes a chamber body, a dielectric window, a gas inlet member, a carrier, an upper radio frequency assembly, and a plurality of ultraviolet light generation devices. The dielectric window is arranged at a top of the chamber body. The gas inlet member is arranged at a center position of the dielectric window and configured to introduce a process gas into the chamber body. The carrier is arranged inside the chamber body and configured to carry a to-be-processed wafer. The upper radio frequency assembly is arranged above the chamber body and configured to ionize the process gas introduced into the chamber body to generate a plasma and first ultraviolet light. The plurality of ultraviolet light generation devices is arranged between the dielectric window and the carrier and around the gas inlet member and configured to generate second ultraviolet light radiating toward the carrier.

10 Claims, 3 Drawing Sheets

(51) Int. Cl.
*H01J 61/30* (2006.01)
*H01J 65/04* (2006.01)
*H10P 76/20* (2026.01)

(52) U.S. Cl.
CPC ....... *H01J 61/302* (2013.01); *H01J 2237/334* (2013.01); *H10P 76/204* (2026.01)

(58) Field of Classification Search
CPC ........... H01J 37/32357; H01J 37/32339; H01J 37/32651; H01J 37/32715; H01J 65/044; H01J 2237/0047; H01J 2237/3156; H01J 61/302; H01J 2231/50021; H01L 21/0273; H01L 21/67069; H01L 21/67115; C23C 16/48; C23C 16/482; C23C 16/483; C23C 16/505
See application file for complete search history.

(56) References Cited

U.S. PATENT DOCUMENTS

| | | | | |
|---|---|---|---|---|
| 7,015,422 | B2 * | 3/2006 | Timans | F27B 17/0025 118/724 |
| 2002/0190027 | A1 | 12/2002 | Felker et al. | |
| 2006/0165904 | A1 * | 7/2006 | Ohara | H01L 21/67115 427/372.2 |
| 2006/0251827 | A1 | 11/2006 | Nowak et al. | |
| 2009/0008577 | A1 * | 1/2009 | Walther | H01J 37/32339 250/492.21 |
| 2009/0114619 | A1 * | 5/2009 | Sotoaka | H01L 21/67115 216/48 |
| 2009/0322240 | A1 * | 12/2009 | Espiau | H05B 41/2806 313/161 |
| 2011/0002674 | A1 * | 1/2011 | Shimizu | H01L 21/324 392/411 |
| 2011/0111533 | A1 * | 5/2011 | Varadarajan | H01L 21/76883 438/692 |
| 2012/0211466 | A1 * | 8/2012 | Choi | H01J 37/321 216/68 |
| 2013/0344704 | A1 * | 12/2013 | Chhabra | C23C 14/00 438/778 |
| 2014/0273482 | A1 | 9/2014 | Tsuchiya et al. | |
| 2015/0064361 | A1 * | 3/2015 | Greer | C23C 16/45527 427/509 |
| 2016/0049291 | A1 * | 2/2016 | Kim | H01L 21/02274 438/478 |
| 2020/0009597 | A1 * | 1/2020 | Ko | H01L 21/67115 |

FOREIGN PATENT DOCUMENTS

| | | | |
|---|---|---|---|
| CN | 103681192 | A | 3/2014 |
| CN | 203557721 | U | 4/2014 |
| CN | 104658944 | A | 5/2015 |
| CN | 111599717 | A | 8/2020 |
| CN | 112151364 | A | 12/2020 |
| JP | H07201495 | A | 8/1995 |
| JP | H1074600 | A | 3/1998 |
| JP | 2000058292 | A | 2/2000 |
| JP | 2007242858 | A | 9/2007 |
| JP | 2018056248 | A | 4/2018 |

* cited by examiner

SEMICONDUCTOR REACTION CHAMBER

CROSS-REFERENCES TO RELATED APPLICATIONS

The present disclosure is a continuation of International Application No. PCT/CN2021/119560, filed on Sep. 22, 2021, which claims priority to Chinese Application No. 202011032583.8 filed on Sep. 27, 2020, the entire content of all of which are incorporated herein by reference.

TECHNICAL FIELD

The present disclosure generally relates to the semiconductor apparatus technology field and, more particularly, to a semiconductor reaction chamber.

BACKGROUND

Inductively Coupled Plasma (ICP) etching process is a process that uses a plasma to bombard a wafer to etch the wafer and performs etching on the wafer after a mask process is performed. That is, after a photoresist on the wafer is exposed to form a mask pattern, the part of the wafer not covered by the photoresist mask is etched to replicate the mask pattern on the wafer.

SUMMARY

Embodiments of the present disclosure provide a semiconductor reaction chamber, including a chamber body, a dielectric window, a gas inlet member, a carrier, an upper radio frequency assembly, and a plurality of ultraviolet light generation devices. The dielectric window is arranged at a top of the chamber body. The gas inlet member is arranged at a center position of the dielectric window and configured to introduce a process gas into the chamber body. The carrier is arranged inside the chamber body and configured to carry a to-be-processed wafer. The upper radio frequency assembly is arranged above the chamber body and configured to ionize the process gas introduced into the chamber body to generate a plasma and first ultraviolet light. The plurality of ultraviolet light generation devices is arranged between the dielectric window and the carrier and around the gas inlet member and configured to generate second ultraviolet light radiating toward the carrier.

The present disclosure has the following beneficial effects.

In the semiconductor reaction chamber of the present disclosure, the upper RF assembly can be configured to ionize the process gas introduced into the chamber body to generate the plasma and the first ultraviolet light. The plurality of ultraviolet light generation devices canbe arranged between the dielectric window and the carrier and around the gas inlet member. The ultraviolet light generation devices can be configured to generate the second ultraviolet light radiating toward the carrier. By cooperating the first ultraviolet light and the second ultraviolet light, the ultraviolet light can be distributed uniformly between the center area and the edge area of the chamber body to improve the uniformity of the curing effect of the photoresist mask on the wafer. Thus, the uniformity of the etching speed can be improved at different positions of the to-be-processed wafer, and the etching consistency among a plurality of to-be-processed wafers can be improved. Therefore, the process performance can be improved.

Figure 1:
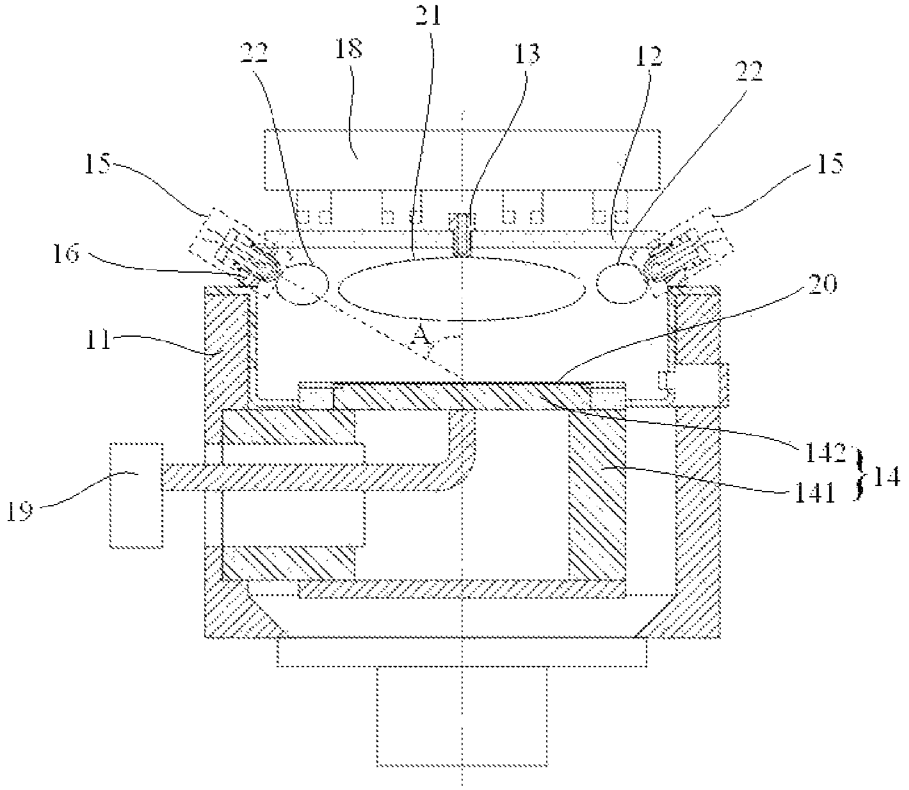
FIG. 1 is a schematic structural diagram of a semiconductor reaction chamber according to some embodiments of the present disclosure.

Reference numerals:

| | | |
|---|---|---|
| 11 Chamber body | 12 Dielectric window | 13 Gas inlet member |
| 14 Carrier | 141 Base | 142 Chuck |
| 15 Ultraviolet light generation device | | 1511 Mounting section |
| 1512 Light-emitting section | 1513 Abutting section | 152 Light-emitting member |
| 153 Electrically connector | | 154 Annular protrusion |
| 16 Support ring body | 17 Sealing member | 18 Upper radio frequency assembly |
| 19 Lower radio frequency assembly | | 20 To-be-processed wafer |
| 21 First ultraviolet light | 22 Second ultraviolet light | |

DETAILED DESCRIPTION OF THE EMBODIMENTS

To facilitate those skilled in the art to better understand the technical solution of the present disclosure, a semiconductor reaction chamber of the present disclosure is described in detail below in connection with the accompanying drawings.

ICP etching process apparatu includes a chamber body, a dielectric window, a nozzle, a carrier, and an upper radio frequency (RF) assembly. The dielectric window is arranged on a top of the chamber body. The nozzle is arranged at a center position of the dielectric window and configured to introduce a process gas into the chamber body. The carrier is arranged in the chamber body below the dielectric window and configured to carry the wafer. The upper RF assembly is arranged outside the chamber body above the dielectric window and configured to feed RF energy into the chamber body through the dielectric window to excite the process gas in the chamber body to form the plasma. The plasma is used to bombard the wafer on the carrier.

When the process gas is excited to form the plasma, ultraviolet light is generated. The ultraviolet is used to cure the photoresist mask of the wafer when the wafer is being etched. Thus, anti-corosion ability of the photoresist mask is enhanced. However, since the nozzle is arranged at the center position of the dielectric window, the process gas ejected from the nozzle will enter a central area of the chamber body first and then diffuse to the surroundings of the chamber body. Thus, the ultraviolet generated when the process gas is excited to form the plasma can diffuse to the surroundings from the center area. Therefore, the distribution of the ultraviolet is not uniform between the center area and an edge area of the chamber body. As a result, the intensity of ultraviolet light irradiation on the surface of the wafer is not uniform at different positions. Moreover, the curing effect of the photoresist mask of the wafer is not uniform, which impairs the uniformity of the etching speed at different positions of the wafer and the etching consistency among wafers.

Figure 2:
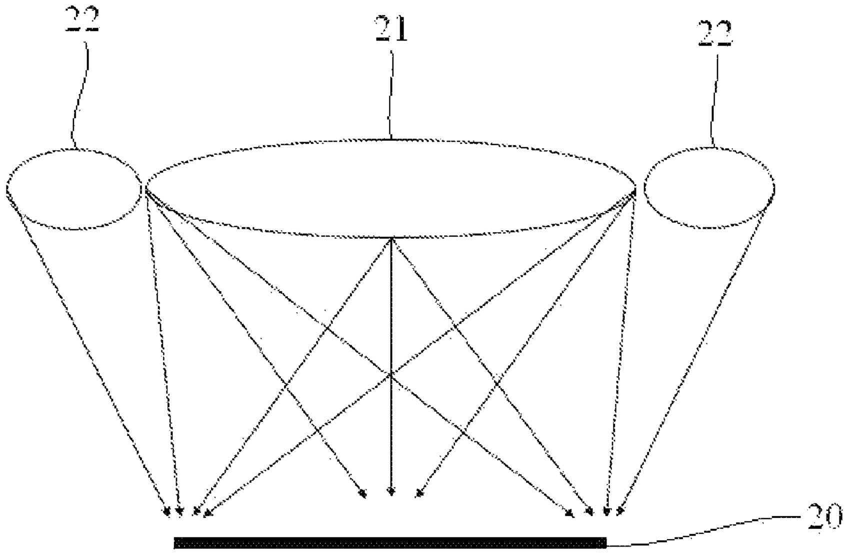
FIG. 2 is a schematic diagram showing a first ultraviolet light and a second ultraviolet light radiating a to-be-processed wafer in the semiconductor reaction chamber according to some embodiments of the present disclosure.

As shown in FIG. 1 and FIG. 2, embodiments of the present disclosure provide a semiconductor reaction chamber, including a chamber body 11, a dielectric window 12, a gas inlet member 13, a carrier 14, an upper radio frequency (RF) assembly 18, and a plurality of ultraviolet light generation devices 15. The dielectric window 12 is arranged at a top of the chamber body 11. The carrier 14 is arranged in the chamber body 11 and configured to carry a to-be-processed wafer 20. The gas inlet member 13 is arranged at a center position of the dielectric window 12 and configured to introduce a process gas into the chamber body 11. The gas inlet member 13 can include, for example, a nozzle. The nozzle can be arranged through the dielectric window 12. A gas outlet end of a gas inlet channel of the nozzle can communicate with the inside of the chamber body 11. The gas inlet end can be configured to be communicated with a gas inlet pipeline (not shown in the figure). However, the structure of the gas inlet member 13 is not limited to this.

The upper RF assembly 18 is arranged above the chamber body 11 and is configured to ionize the process gas introduced into the chamber body 11 to generate a plasma and first ultraviolet light 21. The plurality of ultraviolet light generating devices 15 can be arranged between the dielectric window 12 and the carrier 14 and around the gas inlet member 13. The ultraviolet light generation devices 15 can be configured to generate second ultraviolet light 22 radiating toward the carrier 14. In some embodiments, as shown in FIG. 1, radiation directions of the ultraviolet generation devices 15 (i.e., directions of optical axes) have a predetermined angle with a perpendicular direction of a carrier surface of the carrier 14 that is configured to carry the to-be-processed wafer 20. Thus, the second ultraviolet light 22 can be ensured to radiate toward the carrier 14. In some embodiments, the plurality of ultraviolet light generation devices 15 can be arranged at intervals along a circumference of the chamber body 11 to ensure uniformity of the second ultraviolet light 22 distributed at the circumference of the chamber body 11. Thus, the distribution uniformity of the second ultraviolet light 22 radiated at the carrier can be further improved.

In some embodiments of the present disclosure, the predetermined angle can range from being greater than or equal to 20° to being less than or equal to 70°. Within the angle range, the second ultraviolet light 22 can be ensured to radiate the carrier 14. As shown in FIG. 1, the predetermined angle is 45° (angle A shown in FIG. 1).

In the semiconductor reaction chamber of embodiments of the present disclosure, the upper RF assembly 18 can be configured to ionize the process gas introduced into the chamber body 11 to generate the plasma and the first ultraviolet light 21. In addition, the plurality of ultraviolet generation devices 15 can be arranged between the dialectric window 12 and the carrier 14 and around the gas inlet member 13. The ultraviolet generation devices 15 can be configured to radiate the second ultraviolet light toward the carrier 14. By cooperating the first ultraviolet light 21 and the second ultraviolet light 22, the ultraviolet light between the center area and the edge area of the chamber body 11 can be uniformly distributed. Thus, the uniformity of the curing effect of the photoresist mask of the to-be-processed wafer 20 can be improved. Thus, the uniformity of the etching speed at different positions of the to-be-processed wafer and the etching consistency among a plurality of to-be-processed wafers can be further improved. Therefore, the process performance can be improved.

As shown in FIG. 1, in some embodiments of the present disclosure, the carrier 14 includes a base 141 and a chuck 142. The base 141 can be fixed in the chamber body 11. The chuck 142 can be arranged on the base 141 and correspondingly arranged under the dielectric window 12 that is arranged on the top of the chamber body 11. The chuck 142 can be configured to carry the to-be-processed wafer 20. In some embodiments, the chuck 142 can include an electrostatic chuck.

The upper RF member 18 can be arranged on the top of the chamber body 11 and configured to feed RF energy into the chamber body 11 through the dielectric window 12. Thus, an electromagnetic field can be generated in the chamber body 11 to excite process gas in the chamber body 11 to form the plasma and the first ultraviolet light 21. In some embodiments, the upper RF member 18 may include an inductively coupled plasma coil configured to generate a high-frequency electromagnetic field in an upper area of the chamber body 11, which facilitates to more easily excite the process gas in the chamber body 11 to form the plasma.

A lower RF assembly 19 can be arranged at the outside of the chamber body 11 and extend to a bottom of the chuck 142 through openings arranged at the chamber body 11 and the base 141 in sequence. The lower RF assembly 19 can be electrically connected to the chuck 142. The lower RF assembly 19 can be configured to apply a RF bias to the chuck 142 to attract the plasma in the chamber body 11 to accelerate toward the chuck 142, Thus, the plasma can bombard the to-be-processed wafer 20 carried by the chuck 142. Thus, the etching process can be performed on the to-be-processed wafer 20. For example, the etching can be performed on the to-be-processed wafer 20 after the mask process is performed.

In some embodiments, as shown in FIG. 1 and FIG. 2, in the process of performing etching on the to-be-processed wafer 20 after the mask process is performed, the to-be-processed wafer 20 is first placed on the chuck 142. The gas inlet member 13 can be configured to introduce the process gas into the chamber body 11. The upper RF member 18 can be configured to feed the RF energy into the chamber body 11 through the dielectric window 12. Thus, the process gas in the chamber body 11 can be excited to form the plasma and the first ultraviolet light 21. Meanwhile, the plurality of ultraviolet light generation devices 15 can be configured to emit the second ultraviolet light 22 toward the chuck 142. The lower RF member 19 can be configured to apply the RF bias to the chuck 142 to attract the plasma in the chamber body 11 to bombard the to-be-processed wafer 20 on the chuck 142.

In the process of performing the etching on the to-be-processed wafer 20 after the mask process is performed, the first ultraviolet light 21 and the second ultraviolet light 22 can be radiated to the to-be-processed wafer 20 simultaneously. Thus, as shown in FIG. 2, the first ultraviolet light 21 can be radiated on an entire surface of the to-be-processed wafer 20 (including the center area and the edge area). However, since the plasma is mainly generated in the center area of the chamber body 11, the first ultraviolet light 21 diffuses from the center area to the surroundings. If the first ultraviolet light 21 is used alone for radiation, the ultraviolet light cannot be distributed uniformly between the center area and the edge area of the chamber body 11. Thus, a mount of ultraviolet light radiated at a center area and a edge area of the to-be-processed wafer 20 can be different. Moreover, the curing effect of the photoresist mask on the wafer cannot be uniform. Therefore, with the second ultraviolet light 22, the amount of ultraviolet light radiated at the edge area of the to-be-processed wafer 20 can be increased. Thus, a strength difference of the ultraviolet light radiated at the center area and the edge area of the to-be-processed wafer 20 can be compensated. Further, the uniformity of the curing effect of the photoresist mask on the wafer can be improved, the uniformity of the etching speed at different positions of the to-be-processed wafer can be improved, and the etching consistency among the plurality of to-be-processed wafers can be improved. Therefore, the process performance can be improced. An arrow in FIG. 2 illustrates an effect of the first ultraviolet light 21 and the second ultraviolet light 22 radiating toward the to-be-processed wafer 20. As shown in FIG. 2, when the first ultraviolet light 21 and the second ultraviolet light 22 are radiated toward the to-be-processed wafer 20 simultaneously, the ultraviolet light can be uniformly radiated at the whole surface of the to-be-processed wafer 20.

In practical applications, according to actual needs, the first ultraviolet light 21 and the second ultraviolet light 22 may not be radiated simultaneously. In some embodiments, the first ultraviolet light 21 can be radiated first, and then the second ultraviolet light 22 can be radiated. In some other embodiments, the second ultraviolet light 22 can be radiated first, and then the first ultraviolet light 21 can be radiated. Compared to using the first ultraviolet light 21 alone, the uniformity of the curing effect of the photoresist mask on the wafer can also be improved.

By adjusting the emitting directions of the ultraviolet light generation devices 15 (i.e., the directions of the optical axes), the predetermined angle between the emitting directions and the perpendicular direction of the carrier surface of the carrier 14 configured to carry the to-be-processed wafer 20 can be changed to adjust a ratio of the strengthes of the second ultraviolet light 22 radiating at the center area and the edge area of the to-be-processed wafer 20 to satisfy different processing requirements. In some embodiments, if the predetermined angle is enlarged, the amount of the ultraviolet light radiated at the center area of the to-be-processed wafer 20 can be increased, and the amount of the ultraviolet light radiated at the edge area of the to-be-processed wafer 20 can be reduced. Otherwise, if the predetermined angle is reduced, the amount of the ultraviolet light radiated at the edge area of the to-be-processed wafer 20 can be increased, and the amount of the ultraviolet light radiated at the center area of the to-be-processed wafer 20 can be reduced.

The above etching process can be used to only etch the part not covered by the photoresist mask on the to-be-processed wafer 20 to duplicate the mask pattern on the wafer. However, in practical applications, the plasma will inevitably preform etching on the photoresist mask, which cause differences in the thickness of the photoresist mask at different positions on the to-be-processed wafer 20. The differences can cause different etching speeds at different positions on the to-be-processed wafer 20, which affects the etching uniformity. When a plurality of to-be-processed wafers 20 are etched, since photoresist masks on different to-be-processed wafers 20 are etched at different positions and to different degrees, different patterns can be formed on the different to-be-processed wafers. Thus, the etching among the plurality of to-be-processed wafers 20 can be inconsistent.

To solve the above problem, in some embodiments, in the process of performing the etching on the to-be-processed wafer 20 after the mask process is performed, the upper RF assembly can be configured to generate the plasma and the first ultraviolet light 21. The plurality of ultraviolet light generation devices 15 can be configured to radiate the second ultraviolet light 22 to the to-be-processed wafer 20, which can enhance the curing effect of the photoresist mask on the curing effect wafer 20. That is, compared to using the first ultraviolet light 21 alone, the curing effect of the photoresist mask on the to-be-processed wafer 20 can be further improved. Thus, the photoresist mask on the to-be-processed wafer 20 can be more unlikely to be etched by the plasma. Therefore, only the part on the to-be-processed wafer 20 that is not covered by the photoresist mask can be etched to further improve the uniformity of the etching speeds at different positions of the to-be-processed wafer and the etching consistency among the plurality of to-be-processed wafers. Thus, the process performance can be improved.

In some embodiments, a number of the ultraviolet light generation devices 15 can range from 4 to 20.

In some embodiments, the number of ultraviolet light generation devices 15 can be 8.

In embodiments of the present disclosure, as shown in FIG. 1, the semiconductor reaction chamber further includes a support ring body 16. The support ring body 16 can be arranged between the chamber body 11 and the dielectric window 12. The support ring body 16 includes a plurality of mounting holes that pass through the support ring body 16 and communicate with the inside of the chamber body 11. A number of the mounting holes on the support ring body 16 can be the same as the number of ultraviolet light generation devices 15. The ultraviolet light generation devices 15 can be correspondingly arranged on in the mounting holes. The second ultraviolet light 22 generated by the ultraviolet light generation devices 15 can be radiated into the chamber body 11 through the above mounting holes and reach the surface of the wafer. However, in practical applications, the support ring body 16 and an arrangement manner of the mounting holes arranged on the support ring body 16 are not limited to this.

By arranging the support ring body 16 between the chamber body 11 and the dielectric window 12, the chamber body 11, the dielectric window 12, and the plurality of ultraviolet light generation devices 15 can be conveniently disassembled. Thus, the plurality of ultraviolet light generation devices 15 can be conveniently maintained and replaced.

A predetermined angle is provided between an axis of the above mounting hole and the lower surface of the dielectric window 12. The predetermined angle can be equal to the predetermined anlge between the radiation direction of the ultraviolet light generation device 15 and the lower surface of the dielectric window 12.

Figure 3:
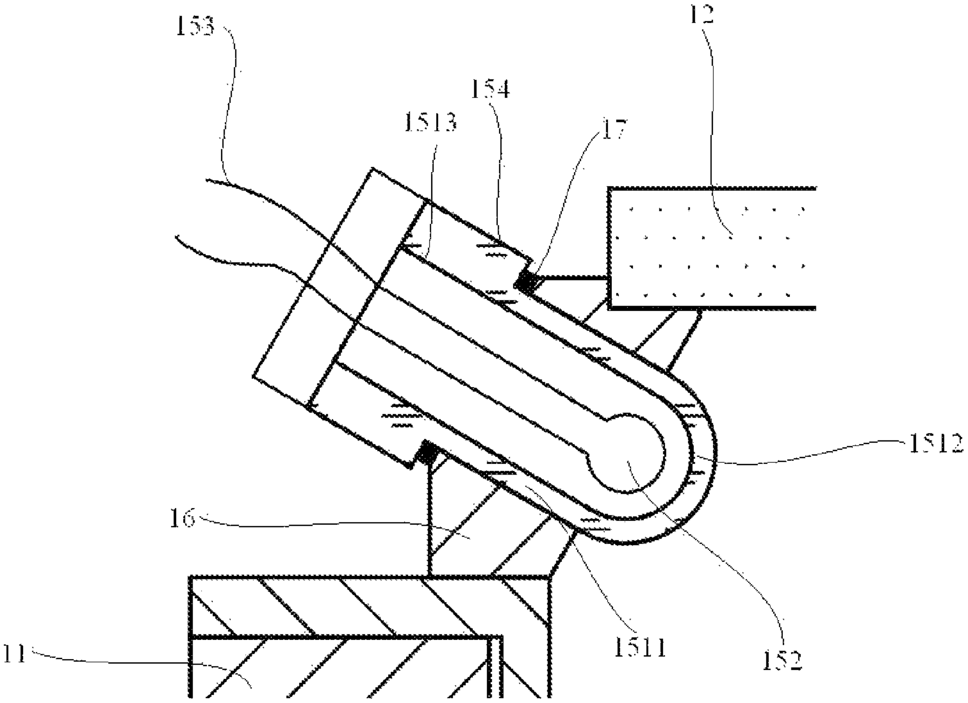
FIG. 3 is a schematic structural diagram showing a ultraviolet light generation device arranged in a support ring body in the semiconductor reaction chamber according to some embodiments of the present disclosure.

In embodiments of the present disclosure, as shown in FIG. 3, the ultraviolet light generation device 15 includes a cover body, a light-emitting member 152, and an electrical connector 153. The light-emitting member 152 can be arranged in the cover body and configured to generate the second ultraviolet light 22. In embodiments of the present disclosure, the light-emitting member 152 can be a short-wave ultraviolet light source or a vacuum ultraviolet light source. In some embodiments, the short-wave ultraviolet light source can emit short-wave ultraviolet light. The short-wave ultraviolet light refers to the ultraviolet light with a wavelength of 100 nm-280 nm. The vacuum ultraviolet light source can emit vacuum ultraviolet light. The vacuum ultraviolet light refers to ultraviolet light with a wavelength of 100 nm-200 nm.

The electrical connector 153 can be electrically connected to the light-emitting member 152 and can be configured to be electrically connected to a power supply device (not shown in the figure). Thus, electrical power of the power supply device can be transmit to the light-emitting member 152. In some embodiments, the electrical connector 153 can include a conductive wire.

In some embodiments, the cover body can include a mounting section 1511 and a light-emitting section 1512. The mounting section 1511 can be arranged in the above mounting hole. The light-emitting section 1512 can be connected to the mounting section 1511 and extends out from the mounting hole into the chamber body 11. The light-emitting section 1512 can be transparent. In some embodiments, the material for making the light-emitting section 1512 can include transparent quartz.

When the power supply device is turned on, the electrical power provided by the power supply device can be transmitted to the light-emitting member 152 through the electrical connector 153. Thus, the light-emitting member 152 can generate the second ultraviolet light 22. The second ultraviolet light 22 can pass through the light-emitting section 1512 of the cover body. That is, the second ultraviolet light 22 can penetrate light-emitting section 1512 to radiate into the chamber body 11.

However, in practical applications, the ultraviolet light generation device 15 is not limited to providing the power to the light-emitting member 152 by electically connecting the electrical connector 153 to the power supply device. The ultraviolet light generation device 15 can also be a device that can directly generate the second ultraviolet light 22. For example, the ultraviolet light generation device 15 can also include a plasma generator or a microwave electrodeless ultraviolet light device. Similar to exciting the process gas by the upper RF member 18 to generate the plasma, the plasma generator is a device configured to excite the gas to generate the plasma. When the gas is excited to generate the plasma, ultraviolet light can also be generated. The ultraviolet light can also be used as the second ultraviolet light 22 described above. The microwave electrodeless ultraviolet light device can include a vacuum quartz tube and a microwave source capable of generating a high-energy microwave field. The vacuum quartz tube does not include a filament nor an electrode. A luminescent material and a thin glow gas can be filled in the vacuum quartz tube. The high-energy microwave field generated by the microwave electrodeless ultraviolet light device through microwave source can be used to ionize the thin glow gas to generate ultraviolet light. The ultraviolet light can also be used as the second ultraviolet light 22.

As shown in FIG. 3, in embodiments of the present disclosure, the cover body further includes an abutting section 1513. The abutting section 1513 can be connected to the above mounting section 1511 and located on a side of the mounting hole away from the inside of the chamber body 11. The abutting section 1513 can abut against the above support ring body 16. The abutting section 1513 can be configured to limit the position of the mounting section 1511 in the mounting hole. The abutting section 1513 can be opaque to prevent light outside the chamber body 11 from entering the cover body through the abutting section 1513 to radiate into the chamber body 11, which can disturb the semiconductor process. Thus, the process performance can be improved.

In some embodiments, the light-emitting section 1512 and the abutting section 1513 can be made of the same material. For example, the light-emitting section 1512 and the abutting section 1513 can be made of transparent quartz. A frosted process can be performed on the abutting section 1513 to make the transparent quartz opaque. In some other embodiments, the material for making the abutting section 1513 can also include an opaque material.

In embodiments of the present disclosure, the light-emitting section 1512 can be an arc-shaped cover, such as a hemispherical cover. The cover of this shape can be helpful for the ultraviolet light to diffuse. Thus, an radiation area of the second ultraviolet light 22 in the chamber body 11 can be increased, which is beneficial to further improve the distribution uniformity of the ultraviolet light in the chamber body 11.

In embodiments of the present disclosure, as shown in FIG. 3, a sealing member 17 is arranged between abutting surfaces of the abutting section 1513 and the support ring body 16 and configured to seal the above mounting hole. The sealing member 17 can include, for example, an annular sealing ring. In some embodiments, an annular protrusion 154 protruding relative to an outer peripheral wall of the mounting section 1511 is arranged on an outer peripheral wall of the abutting section 1513. An end surface of the annular protrusion 154 close to the inside of the chamber body 11 can abut against a surface of the support ring body 16 opposite to the end surface. The sealing member 17 can be arranged between the end surface of the annular protrusion 154 and the surface of the support ring body 16 opposite to the end surface. With the sealing member 17, on one aspect, the gas outside the chaber body 11 can be prevented from entering into the chamber body 11 to be mixed with the process gas in the chamber body 11 or impact a process pressure in the chamber body 11. Thus, the disturbance of the semiconductor process can be avoided. On another aspect, the gas in the chamber body 11 can be prevented from leaking to the outside of the chamber body 11 to contaminate the environment or cause safety hazards.

The surface of the support ring body 16 opposite to the end surface of the annular protrusion 154 can be an inclined surface. The inclined surface can be perpendicular to an axis of the above mounting hole. Thus, when the annular protrusion 154 abuts against the inclined surface, an axis of the mounting section 1511 can be parallel to the axis of the mounting hole to ensure the mounting section 1511 to be able to smoothly inserted into the mounting hole.

In embodiments of the present disclosure, the process chamber may further include a controller (not shown in the figure). The controller can be electrically connected to the power supply device configured to supply power to the plurality of ultraviolet light generation devices 15 and can be configured to send a control signal to the power supply device to turn on or off the power supply device and control a power supply time length of the the power supply device. Thus, according to the actual semiconductor process, time periods and time lengths of radiatoin of the ultraviolet light of the ultraviolet light generation device 15 can be controlled to realize automatical control of the plurality of ultraviolet generation devices 15 to improve the control flexibility.

For example, the time periods and time lengths of the radiation of the ultraviolet light of the plurality of ultraviolet generation devices 15 can be controlled according to an operation state of the upper RF assembly 18 or the lower RF assembly 19. In some embodiments, for example, when using the upper RF assembly 18 to generate the first ultraviolet light 21, the controller can control the plurality of ultraviolet generation devices 15 to generate the second ultraviolet light 22 simultaneously. For another example, the controller can control the plurality of ultraviolet light generation devices 15 to generate the second ultraviolet light 22 before or after the upper RF assembly 18 generates the first ultraviolet light 21. For another example, the controller can futher control the plurality of ultraviolet light devices 15 to generate the second ultraviolet light 22 simultaneously when the lower RF assembly 19 applies the RF bias to the chuck 142.

In some embodiments, the control signal output by the controller can include any one or more of a continuous wave signal, a synchronous pulse signal, and an asynchronous pulse signal.

In some embodiments, when the above control signal output by the controller is the continuous wave signal, the controller can control the ultraviolet light generation devices 15 to continuously generate the second ultraviolet light 22.

When the above control signal output by the controller is the synchronous pulse signal, the controller can control the ultraviolet light generation devices 15 to simultaneously generate the second ultraviolet light 22 when using the upper RF assembly 18 to form the plasma and the first ultraviolet light 21, and/or using the lower RF assembly 19 to apply the RF bias to the chuck 142. That is, by using the synchronous pulse signal, turning on or off the ultraviolet light generation devices 15 and turning on or off the upper RF assembly 18 and/or the lower RF assembly 19 can be performed simultaneously. When the ultraviolet light generation devices 15 are turned on, the upper RF assembly 18 and/or the lower RF assembly 19 can be turned on. When the ultraviolet light generation devices 15 are turned off, the upper RF assembly 18 and/or the lower RF assembly 19 is turned off.

When the above control signal output by the controller is the asynchronous pulse control signal, the controller can control the ultraviolet light generation devices 15 to stop generating the second ultraviolet light 22 synchronously when using the upper RF assembly 18 to form the plasma and the first ultraviolet light 21 and/or using the lower RF assembly 19 to apply the RF bias to the chuck 142. That is, by using the asynchronous pulse control signal, turning on or off the ultraviolet light generation devices 15 and turning off or on the upper RF assembly 18 and/or the lower RF assembly 19 can be performed synchronously. When the ultraviolet light generation devices 15 are turned on, the upper RF assembly 18 and/or the lower RF assembly 19 can be turned off. When the ultraviolet light generation devices 15 are turned off, the upper RF assembly 18 and/or the lower RF assembly 19 can be turned on.

In summary, in the semiconductor reaction chamber of embodiments of the present disclosure, the process gas introduced into the chamber body can be ionized by the upper RF assembly to generate the plasma and the first ultraviolet light. The plurality of ultraviolet light generation devices can be arranged between the dielectric window and the carrier and around the gas inlet member. The ultraviolet light generation devices can be configured to generated the second ultraviolet light radiating toward the carrier. By cooperating the first ultraviolet light and the second ultraviolet light, the ultraviolet light can be uniformly distributed between the center area and the edge area of the chamber body. Thus, the uniformity of the curing effect of the photoresist mask on the wafer can be improved. Moreover, the uniformity of the etching speed at the different positions of the to-be-processed wafer can be improved, and the etching consistency among the plurality of to-be-processed wafers can be improved. Thus, the process performance can be improved.

The above embodiments are only exemplary embodiments used to illustrate the principle of the present disclosure. However, the present disclosure is not limited here. For those skilled in the art, various modifications and improvements can be made without departing from the spirit and essence of the present disclosure. These modifications and improvements are also within the scope of the present disclosure.

What is claimed is:

1. A semiconductor reaction chamber comprising: a chamber body, a dielectric window arranged at a top of the chamber body; a gas inlet member arranged at a center position of the dielectric window and configured to introduce a process gas into the chamber body; a carrier arranged inside the chamber body and configured to carry a to-be-processed wafer; an upper radio frequency assembly arranged above the chamber body and configured to ionize the process gas introduced into the chamber body to generate a plasma and first ultraviolet light; and a plurality of ultraviolet light generation devices arranged between the dielectric window and the carrier and around the gas inlet member and configured to generate second ultraviolet light radiating toward the carrier, the plurality of ultraviolet light generation devices being arranged at intervals along a circumference of the chamber body, wherein the second ultraviolet light in conjunction with the first ultraviolet light causes overall ultraviolet light radiation toward the to-be-processed wafer carried by the carrier to be uniformly distributed on a surface of the to-be-processed wafer; a support ring body arranged between the chamber body and the dielectric window and including a plurality of mounting holes passing through the support ring body and communicating with inside of the chamber body, the ultraviolet light generation devices being arranged correspondingly in the plurality of mounting holes, wherein an axis of each of the plurality of mounting holes forms a predetermined angle with a lower surface of the dielectric window, the predetermined angle being equal to a first predetermined angle between a radiation direction of a corresponding ultraviolet light generation device of the plurality of ultraviolet light generation devices and the lower surface of the dielectric window; wherein an ultraviolet light generation device of the plurality of ultraviolet light generation devices include: a cover body including: a mounting section arranged in one mounting hole of the plurality of mounting holes; and a light-emitting section connected to the mounting section, extending out from the mounting hole into the chamber body, and being transparent; a light-emitting member arranged in the cover body and configured to generate the second ultraviolet light; and an electrical connector electrically connected to the light-emitting member and a power supply device to transmit power of the power supply device to the light-emitting member.

2. The semiconductor reaction chamber according to claim 1, wherein the light-emitting section is an arc-shaped cover body.

3. The semiconductor reaction chamber according to claim 1, wherein the cover body further includes: an abutting section connected to the mounting section, located on a side of the mounting hole away from the chamber body, abutting against the support ring body to limit a position of the mounting section in the mounting hole, and being opaque.

4. The semiconductor reaction chamber according to claim 3, wherein a sealing member is arranged between surfaces of the abutting section and the support ring body abutting against to each other and configured to seal the mounting hole.

5. The semiconductor reaction chamber according to claim 1, further comprising: a controller electrically connected to a power supply device configured to supply power to the plurality of ultraviolet light generation devices and configured to send a control signal to the power supply device to turn on or off the power supply device and to control a power supply time length of the power supply device.

6. The semiconductor reaction chamber according to claim 5, wherein the control signal output by the controller includes any one or more of a continuous wave signal, a synchronous pulse signal, and an asynchronous pulse signal.

7. The semiconductor reaction chamber according to claim 1, wherein an angle between an optical axis of one ultraviolet light generation device of the plurality of ultraviolet light generation devices and a perpendicular direction of a carrying surface of the carrier configured to carry the to-be-processed wafer ranges from being greater than and equal to 200 to being less than or equal to 70°.

8. The semiconductor reaction chamber according to claim 1, wherein the light-emitting member is a short-wave ultraviolet light source or a vacuum ultraviolet light source.

9. The semiconductor reaction chamber according to claim 1, wherein the second ultraviolet light increases an amount of ultraviolet light radiated at an edge area of the to-be-processed wafer relative to a center area of the to-be-processed wafer so as to compensate a strength difference of the first ultraviolet light between the center area and the edge area, to cause the overall ultraviolet light radiation to be uniformly distributed on the surface of the to-be-processed wafer.

10. The semiconductor reaction chamber according to claim 1, wherein the overall ultraviolet light radiation is uniformly distributed on the surface of the to-be-processed wafer to cure a photoresist mask of the to-be-processed wafer undergoing etching.

* * * * *